(12) United States Patent
Suzuki

(10) Patent No.: US 7,957,489 B2
(45) Date of Patent: Jun. 7, 2011

(54) DIGITAL AMPLIFIER AND TELEVISION RECEIVING APPARATUS

(75) Inventor: Noriaki Suzuki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 1054 days.

(21) Appl. No.: 11/668,899

(22) Filed: Jan. 30, 2007

(65) Prior Publication Data

US 2007/0242777 A1   Oct. 18, 2007

(30) Foreign Application Priority Data

Feb. 17, 2006   (JP) ................. 2006-040962

(51) Int. Cl.
*H03K 9/00* (2006.01)
*H04L 27/00* (2006.01)
(52) U.S. Cl. .......... 375/316; 330/10; 348/707; 375/238
(58) Field of Classification Search .................. 375/316, 375/238; 330/10; 348/707
See application file for complete search history.

(56) References Cited

U.S. PATENT DOCUMENTS

| 5,375,188 | A | 12/1994 | Serikawa et al. | |
|---|---|---|---|---|
| 6,498,531 | B1* | 12/2002 | Ulrick et al. | 330/10 |
| 7,110,737 | B2 | 9/2006 | Sawashi et al. | |
| 7,284,261 | B1* | 10/2007 | Connelly | 725/140 |
| 2002/0089376 | A1 | 7/2002 | Miao | |
| 2003/0216132 | A1* | 11/2003 | Sawashi et al. | 455/341 |
| 2004/0192192 | A1 | 9/2004 | Mukai et al. | |
| 2007/0052382 | A1 | 3/2007 | Nomura | |
| 2007/0274387 | A1* | 11/2007 | Kurahashi | 375/240.13 |

FOREIGN PATENT DOCUMENTS

| JP | 04-359298 A | | 12/1992 |
|---|---|---|---|
| JP | 2005-289693 | * | 5/1993 |
| JP | 05-289693 A | | 11/1993 |
| JP | 11-055626 A | | 2/1999 |
| JP | 2001-111970 A | | 4/2001 |
| JP | 2002-159099 A | | 5/2002 |
| JP | 2002-272126 A | | 9/2002 |
| JP | 2003-517224 A | | 5/2003 |
| JP | 2003-289227 A | | 10/2003 |
| JP | 2004-023216 A | | 1/2004 |
| JP | 2004-048701 | * | 2/2004 |
| JP | 2004-048701 A | | 2/2004 |
| JP | 2004-072707 A | | 3/2004 |
| JP | 2004-304536 A | | 10/2004 |
| JP | 2004-363699 A | | 12/2004 |
| JP | 2005-051303 | * | 2/2005 |
| JP | 2005-051303 A | | 2/2005 |
| JP | 2006-025565 A | | 1/2006 |

* cited by examiner

*Primary Examiner* — David C. Payne
*Assistant Examiner* — Nader Bolourchi
(74) *Attorney, Agent, or Firm* — Canon USA, Inc. IP Division

(57) ABSTRACT

A digital amplifier including a clock generation unit configured to output a clock signal, a pulse width modulation unit configured to pulse width-modulate the clock signal based on an input signal, a driving unit configured to alternately drive at least two switching elements which convert the output of the pulse width modulation unit, an analysis unit configured to analyze characteristics of the input signal, and a control unit configured to control frequencies of the clock signal based on an output of the analysis unit.

4 Claims, 9 Drawing Sheets

DIGITAL AMPLIFIER AND TELEVISION RECEIVING APPARATUS

BACKGROUND OF THE INVENTION

1. Field of the Invention

The present invention relates to a digital amplifier and a television receiving apparatus using the digital amplifier.

2. Description of the Related Art

A digital amplifier is generally configured to convert amplitude information of an analog audio waveform into time information which switches on/off of a switching unit in output. The higher this switching frequency, the larger the amount of information per unit time becomes. In addition, if the switching frequency is high, an image noise has only a small influence on an audible bandwidth. Accordingly, an audio play can be performed with fidelity up to a high frequency.

However, a consumption current appears by a through current and a charge/discharge current of a parasitic capacity for every on/off of the switching unit. Therefore, the higher a switching frequency, the larger electric power consumption becomes.

As a method for reducing electric power consumption, Japanese Patent Application Laid-Open No. 2004-72707 discusses that the frequency of a drive pulse supplied to a switching element can be reduced when no input signal is detected, or corresponding to an average level of the input signal.

Further, Japanese Patent Application Laid-Open No. 2004-363699 discusses that a delay time in a timing adjustment circuit which suppresses a through current can be controlled to change the delay time between a high tone quality mode and a low electric power consumption mode.

However, the method discussed in Japanese Patent Application Laid-Open No. 2004-72707 has a problem in that the input signal can be either a music signal that is easily affected by an image noise, or a speech signal that is hardly affected by the image noise. Accordingly, regardless of the music signal or the speech signal, when a signal level has a level not less than a fixed level, audio play is performed in a state of a high switching frequency, resulting in high electric power consumption.

Furthermore, in Japanese Patent Application Laid-Open No. 2004-363699, the delay time in the timing adjustment circuit is controlled, which suppresses the through current dependent on required signal quality and electric power consumption. However, this delay time in the timing adjustment circuit absorbs variation of a response time of the switching element. Accordingly, if the delay time is reduced to perform audio play with high fidelity, electric power consumption varies greatly depending on the response time of the switching element.

SUMMARY OF THE INVENTION

Exemplary embodiments of the present invention are directed to a digital amplifier which detects the characteristics of an input signal to control the frequency of a clock signal based on the characteristics so that power saving can be achieved without reducing fidelity of audio reproduction, and a television receiving apparatus using such a digital amplifier can be realized.

According to an aspect of the present invention, a digital amplifier includes a clock generation unit configured to output a clock signal, a pulse width modulation unit configured to pulse width-modulate the clock signal based on an input signal, a converting unit configured to convert the output of the pulse width modulation unit, an analysis unit configured to analyze signal characteristics of the input signal, and a control unit configured to control frequencies of the clock signal based on an output of the analysis unit.

According to another aspect of the present invention, a television receiving apparatus uses the digital amplifier as an audio amplifier.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DETAILED DESCRIPTION OF THE EMBODIMENTS

Various exemplary embodiments, features, and aspects of the invention will be described in detail below with reference to the drawings.

A digital amplifier according to an exemplary embodiment of the present invention is applied to an audio amplifier for audio equipment, an audio amplifier for image equipment and an audio amplifier for a television receiving apparatus.

Particularly, as the audio amplifier for the television receiving apparatus, the digital amplifier is widely applied to process audio signals from programs composed mainly of speech containing little information at high frequencies, such as a news program, to programs containing information at high frequencies such as a music program. Under such circumstances, lower electric power consumption can be realized without degrading a tone quality if the operating frequency of the digital amplifier is changed depending on the contents of the program.

As discussed, speech signal has little information at a high frequency and an image noise exerts only a small influence on an audible bandwidth. Therefore, when an input signal is speech, the digital amplifier can be operated at a low-frequency which results in lower electric power consumption without affecting the characteristic of an audio output.

It can be determined whether the input signal is a speech group, such as announcement, or a music group. If the input signal is speech, lower electric power consumption can be achieved without affecting the characteristic of audio output.

An exemplary embodiment of the present invention will be described with reference to an audio amplifier for a television receiving apparatus.

First Exemplary Embodiment

Figure 1:
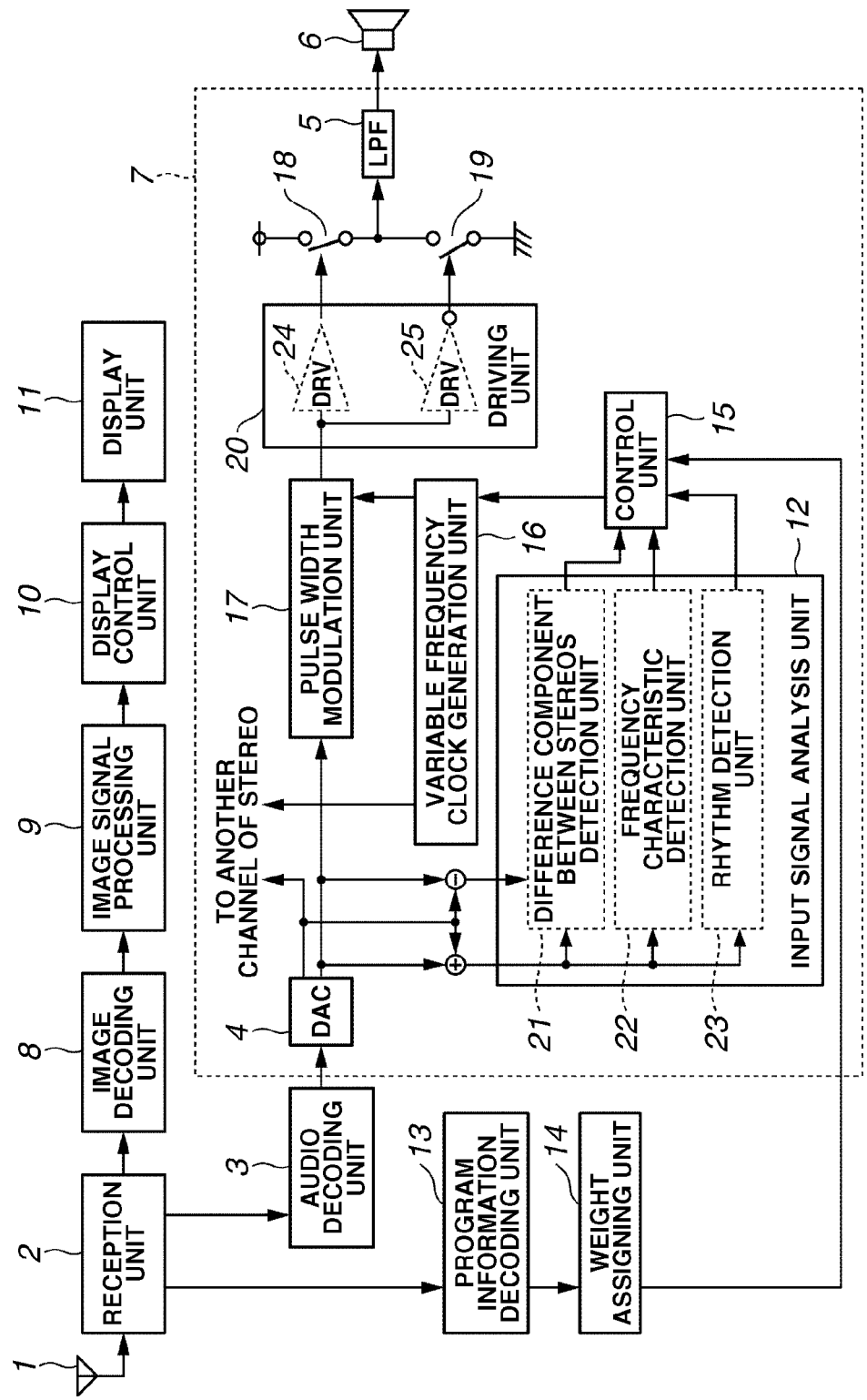
FIG. 1 is a block diagram illustrating a television receiving apparatus mounted with a digital amplifier according to a first exemplary embodiment of the present invention.

FIG. 1 is a block diagram illustrating a television receiving apparatus mounted with a digital amplifier according to a first exemplary embodiment of the present invention. In this exemplary embodiment, a half-bridge output configuration is illustrated. However, a full-bridge output configuration can also be employed.

In a frequency bandwidth received by an antenna unit 1, only a desired broadcast is selected by a reception unit 2, and demodulated to a multiplexed signal such as an image, an audio, and program information. Each of the demodulated multiplexed signals is decoded by an image decoding unit 8, an audio decoding unit 3, and a program information decoding unit 13.

Image data decoded by the image decoding unit 8 is adjusted to a desired characteristic by an image signal processing unit 9. After timing of a signal and an amplitude are adjusted by a display control unit 10, an image is displayed by a display unit 11.

Audio data decoded by an audio decoding unit 3 are input to a digital amplifier 7. The digital amplifier 7 includes a D/A converter unit (DAC) 4, a pulse width modulation unit 17, a variable frequency clock generation unit 16, a first switching unit 18, a second switching unit 19, a driving unit 20, an input signal analysis unit 12, a control unit 15 and a low-pass filter unit 5.

Figure 5:
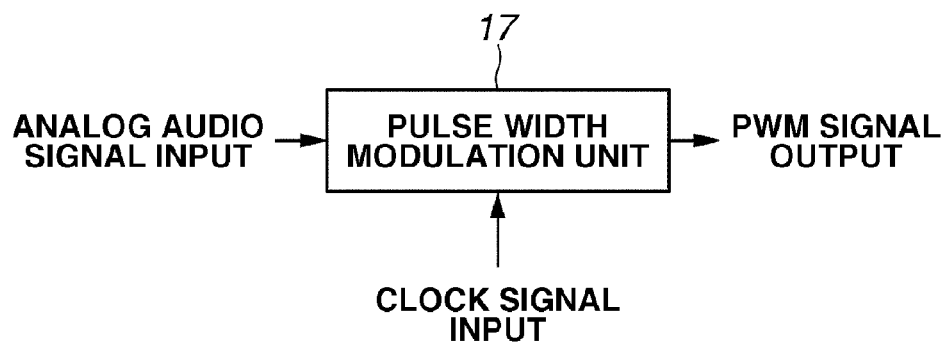
FIG. 5 is a block diagram representing an input/output signal of a pulse width modulation unit according to a first exemplary embodiment.
Figure 6:
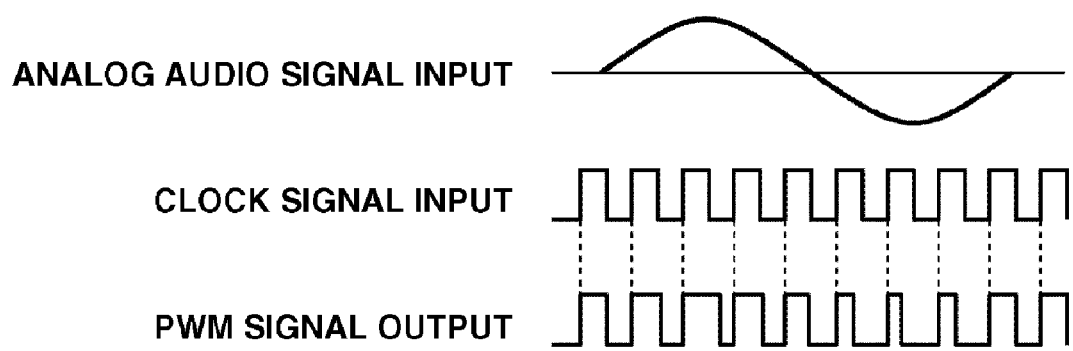
FIG. 6 is a diagram illustrating a waveform of an input/output signal of a pulse width modulation unit according to a first exemplary embodiment.

In the digital amplifier 7, the audio data are converted into an analog audio signal in stereo by the D/A converter unit 4. As shown in FIGS. 5 and 6, the pulse width modulation unit 17 outputs a pulse width modulation (PWM) signal which is generated by modulating the pulse width of a clock signal according to a change in amplitude of the analog audio signal. The pulse frequency of the PWM signal is determined by the output frequency of the variable frequency clock generation unit 16.

The PWM signal is converted into two PWM signals, which have reversed polarities to each other, by a buffer amplification unit 24 and a reversed buffer amplification unit 25 of the driving unit 20. By two converted PWM signals, the first switching unit 18 and the second switching unit 19 are reciprocally switched on/off, and the PWM switching signal is generated which has the amplitude between an electric source and a ground electric potential. The PWM switching signal is converted into an analog audio signal by passing through the low-pass filter 5, and transduced into an audible tone by a loudspeaker unit 6. Converting unit comprises driving unit 20, the first and second switching unit 18, 19 and the low-pass filter 5. The PWM signal is re-converted to amplitude modulation signal for driving loudspeaker by the converting unit.

The type of a category decoded by the program information decoding unit 13 is converted into a category signal set for each type of the category by a weighting unit 14, for example, a voltage value of a signal shows music>movie>variety>news.

An electronic program guide (EPG) in a current broadcast and metadata in a server type broadcast are superimposed with category information of each program. For example, when a program category is "news", it can be determined that the program is mainly speech. When a program category is "music", it can be determined that the program is mainly music.

Further, the analog audio signal in stereo output from the D/A converter unit 4 is converted into a stereo sum signal L+R and a stereo difference signal L−R, and input into the input signal analysis unit 12.

In the input signal analysis unit 12, as described below, an analog audio signal is subjected to signal processing in a difference-component between stereos detection unit 21, a frequency characteristic detection unit 22 and a rhythm detection unit 23.

Figure 2:
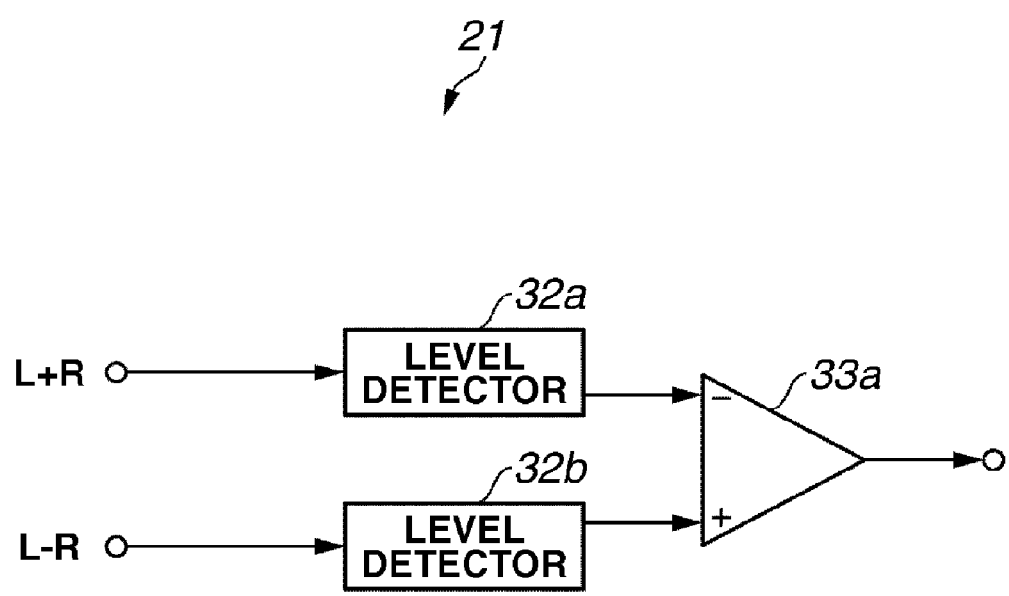
FIG. 2 is a block diagram illustrating a difference component between stereos detection unit of an input signal analysis unit according to a first exemplary embodiment.

As illustrated in FIG. 2, each level of the stereo sum signal L+R and the stereo difference signal L−R input to the difference-component between stereos detection unit 21 is detected by level detectors 32a and 32b, and input into a level comparator 33a as a stereo sum signal level and a stereo difference signal level. The level comparator 33a outputs a stereo comparison signal corresponding to an input level, to the control unit 15.

That is, in the difference-component between stereos detection unit 21, the stereo comparison signal which is a lateral difference of a sound volume, is output as a control element in the control unit 15 to provide a parameter indicating the signal characteristics of an input signal.

Generally, audio announcements, such as a news program, are monaurally recorded. Further, in a movie, since speech is supposed to be output from a center loudspeaker, when the audio signal of the speech is down-mixed to a stereo signal, the audio signal of the speech provides a monaural signal laterally having the same phase.

On the other hand, most music signals are stereophonically recorded. Accordingly, if a laterally different component in a stereo signal is small, a detected audio signal is determined to be a speech signal.

Figure 3:
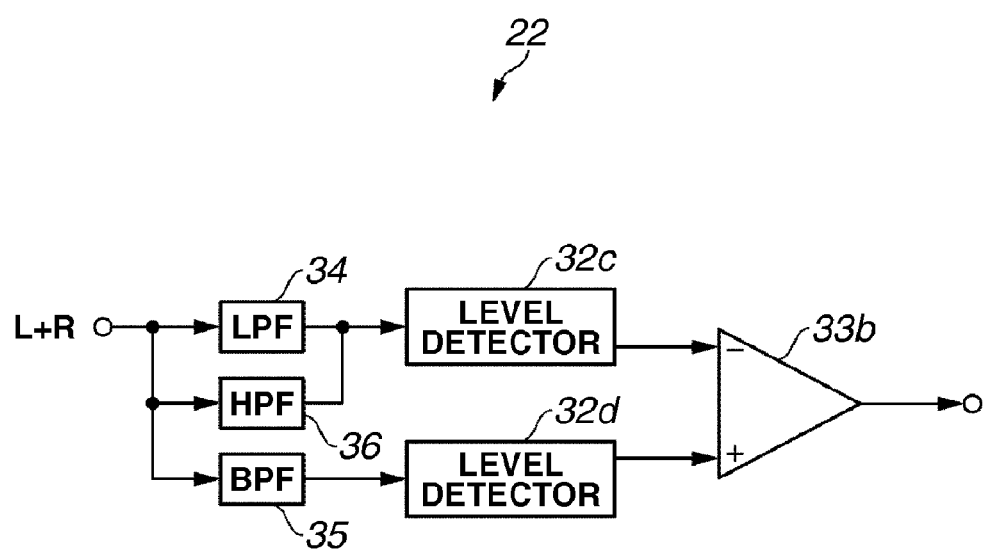
FIG. 3 is a block diagram illustrating a frequency characteristic detection unit of an input signal analysis unit according to a first exemplary embodiment.

As illustrated in FIG. 3, the stereo sum signal L+R input to the frequency characteristic detection unit 22 is input to two level detectors 32c and 32d through a low-pass filter (LPF) 34, a high-pass filter (HPF) 36, and a band-pass filter (BPF) 35.

A high and low frequency level, and a medium frequency level which are output from the level detectors 32c and 32d are input to the level comparator 33b. The level comparator 33b outputs a bandwidth signal corresponding to an input level to the control unit 15. That is, in the frequency characteristic detection unit 22, the stereo sum signal is divided into three frequency bandwidths including a high frequency, a medium frequency, and a low frequency. Then, the frequency characteristic detection unit 22 outputs a bandwidth signal as a control element in the control unit 15 such that a difference between the high and low frequency level, and the medium frequency level becomes a parameter indicating the signal characteristics of an input signal.

A speech frequency of human voice mainly includes a medium frequency component. However, the frequency of a music instrument includes many low frequency components and high frequency components. Therefore, when the medium frequency component is greater when compared with the high and low frequency level, the detected audio signal is determined to be the speech signal.

Figure 4:
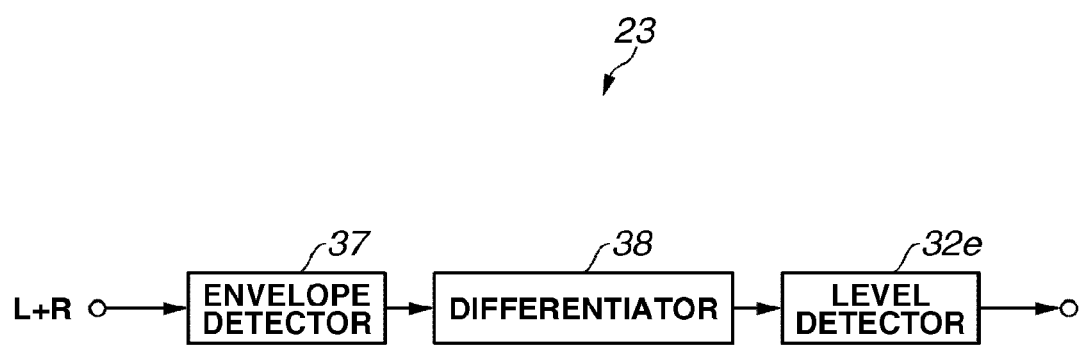
FIG. 4 is a block diagram illustrating a rhythm detection unit of an input signal analysis unit according to a first exemplary embodiment.

Further, as illustrated in FIG. 4, the stereo sum signal L+R input to the rhythm detection unit 23 is input to a level detector 32e through an envelop detector 37 and a differentiator 38.

The level detector 32e outputs a rhythm signal corresponding to an input level to the control unit 15.

That is, the rhythm detection unit 23 detects the steepness of an amplitude change of the stereo sum signal. Thus, the rhythm signal representing an audio rhythm is output as a control element in the control unit 15 to provide a parameter indicating the signal characteristics of an input signal.

The amplitude of a speech frequency varies randomly and smoothly. However, a music signal sharply changes the amplitude in every fixed time to form rhythm. Accordingly, when the variation of the amplitude is smooth and has no continuity, the detected audio signal is determined to be the speech signal.

The above-described category signal, stereo comparison signal, bandwidth signal, and rhythm signal are input to the control unit 15. The control unit 15 executes computation of each input signal, such as addition, to output a control signal based on the computation to the variable frequency clock generation unit 16.

For example, in the case where the output of the input signal analysis unit 12 is multistage or linear, when the input signal is determined to be a "music program" based on the category signal, weighting can be performed to shift a whole operation to a higher frequency.

As the signal voltage value of the control signal increases, the variable frequency clock generation unit 16 outputs a higher frequency clock. Accordingly, the PWM switching frequency of the digital amplifier 7 becomes higher. The control unit 15 controls the variable frequency clock generation unit 16 by the control signal so as to change frequencies of the clock signal dynamically.

As the type of a category, high frequency switching is provided in order of music>movie>variety>news. That is, when, as the type of the category, a "music" program is received, fidelity takes priority. When a "news" program is received, lower electric power consumption takes priority in playing the program. Further, when the "music" program is being received, in a scene including mainly speech, such as commentary by a show host, a program is played in a condition where low electric power consumption takes priority.

The above process is performed because it is detected that in the difference-component between stereos detection unit 21, a level of a stereo difference signal is smaller compared with a stereo sum signal, in the frequency characteristic detection unit 22, a high frequency and a low frequency level are smaller compared with a medium frequency level, and in the rhythm detection unit 23, a level of an amplitude variation is smaller compared with a time of the amplitude variation, respectively.

Accordingly, even when the music program is being played, in a scene including mainly speech, low electric power consumption takes priority. Thus, the whole electric power consumption is reduced during a whole play time. Further, since in the scene including mainly speech, the audio signal has little high frequency information, a user does not recognize the degradation of tone quality. Furthermore, when a "news" program is being received, when a music concert is announced, a program is played while fidelity takes priority.

The above process is performed because it is detected that in the difference-component between stereos detection unit 21, a level of a stereo difference signal is greater compared with a stereo sum signal, in the frequency characteristic detection unit 22, a high frequency and a low frequency levels are greater compared with a medium frequency level, and in the rhythm detection unit 23, a level of an amplitude variation is greater compared with a time of the amplitude variation, respectively.

Thus, even when the news program is played, if a music scene appears, fidelity takes priority corresponding to an audio signal, therefore a user does not feel dissatisfaction with tone quality.

In the television receiving apparatus according to the present exemplary embodiment, when a music scene is played, high frequency switching operation placing importance on fidelity is performed. On the other hand, when a scene including mainly speech is played, low frequency switching operation placing importance on low electric power consumption is performed. Therefore, low electric power consumption can be achieved without degradation of tone quality which can be noticed by a user.

Second Exemplary Embodiment

Figure 7:
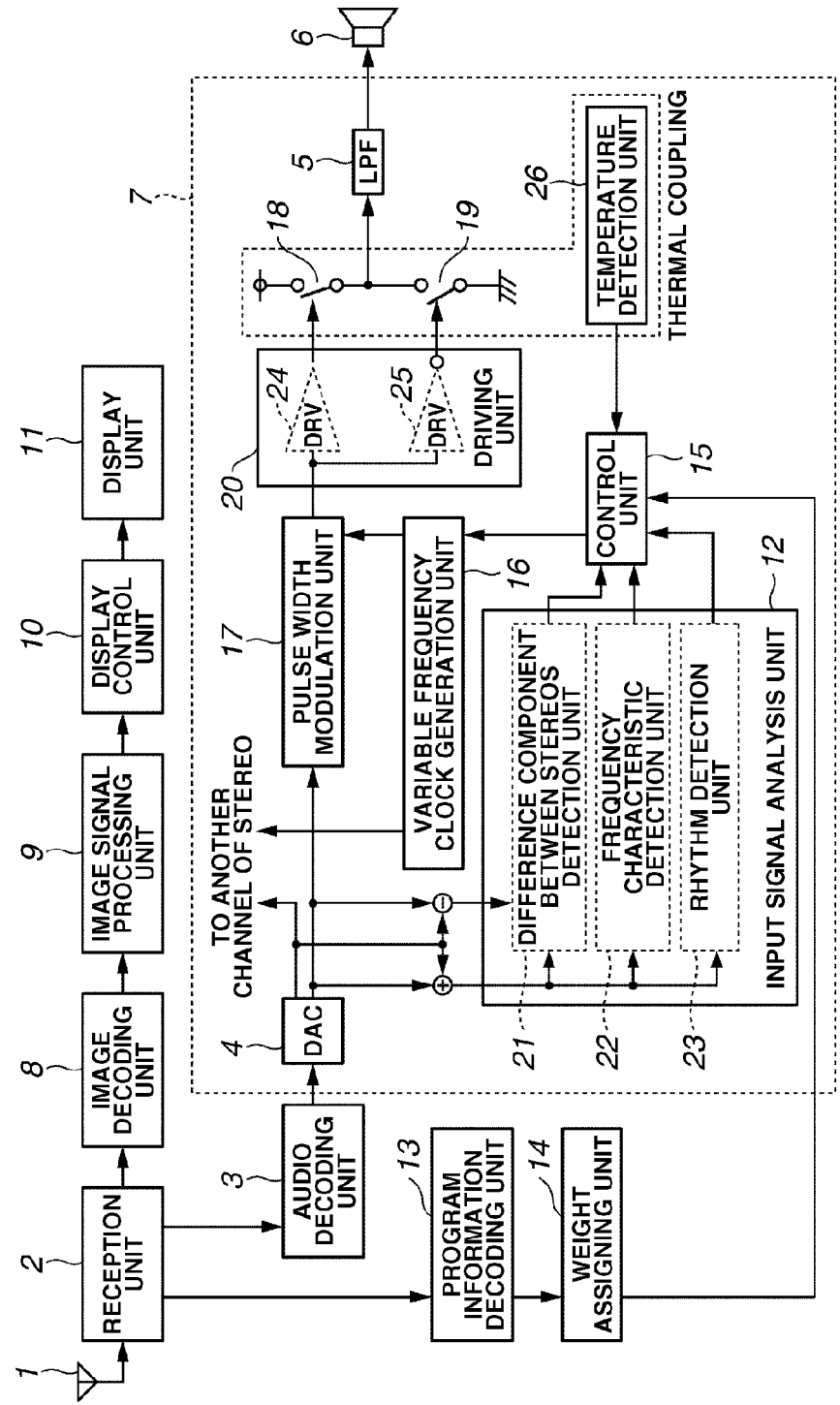
FIG. 7 is a block diagram illustrating a television receiving apparatus mounted with a digital amplifier according to a second exemplary embodiment of the present invention.

FIG. 7 is a block diagram illustrating a television receiving apparatus mounted with a digital amplifier according to a second exemplary embodiment of the present invention. The television receiving apparatus of the present embodiment is similar to the television receiving apparatus of the first embodiment, with the addition of a temperature detection unit 26. As such, the same reference numbers used in the first embodiment are used in the present embodiment. Detailed descriptions are omitted herein, with the exception of a thermally coupled temperature detection unit 26. A temperature of the first switching unit 18 and the second switching unit 19 is detected by the temperature detection unit 26. The higher the temperature, the lower voltage is output.

When the type of the category decoded by the program information decoding unit 13 is a music program, and a high voltage signal representing music is output as an analyzed result from the input signal analysis unit 12, a clock output by the variable frequency clock generation unit 16 becomes high-frequency. At this time, the first switching unit 18 and the second switching unit 19 perform high frequency switching operation. Accordingly, the number of through currents flowing per unit time is increased and electric power consumption becomes larger. If the high frequency switching operation continues, a temperature rises. If the temperature detection unit 26 detects high temperature, the control unit 15 outputs a low voltage signal as a control signal that performs control such that the clock output from the variable frequency clock generation unit 16 becomes a low frequency.

As a result of such a feedback system, a rise in temperature can be suppressed within a fixed range, and miniaturization of a heat radiation mechanism and a safe digital amplifier can be realized. Further, when an ambient temperature of the digital amplifier rises, a similar operation is performed, therefore the digital amplifier is realized that can perform a safe operation in a wide temperature range.

Third Exemplary Embodiment

Figure 8:
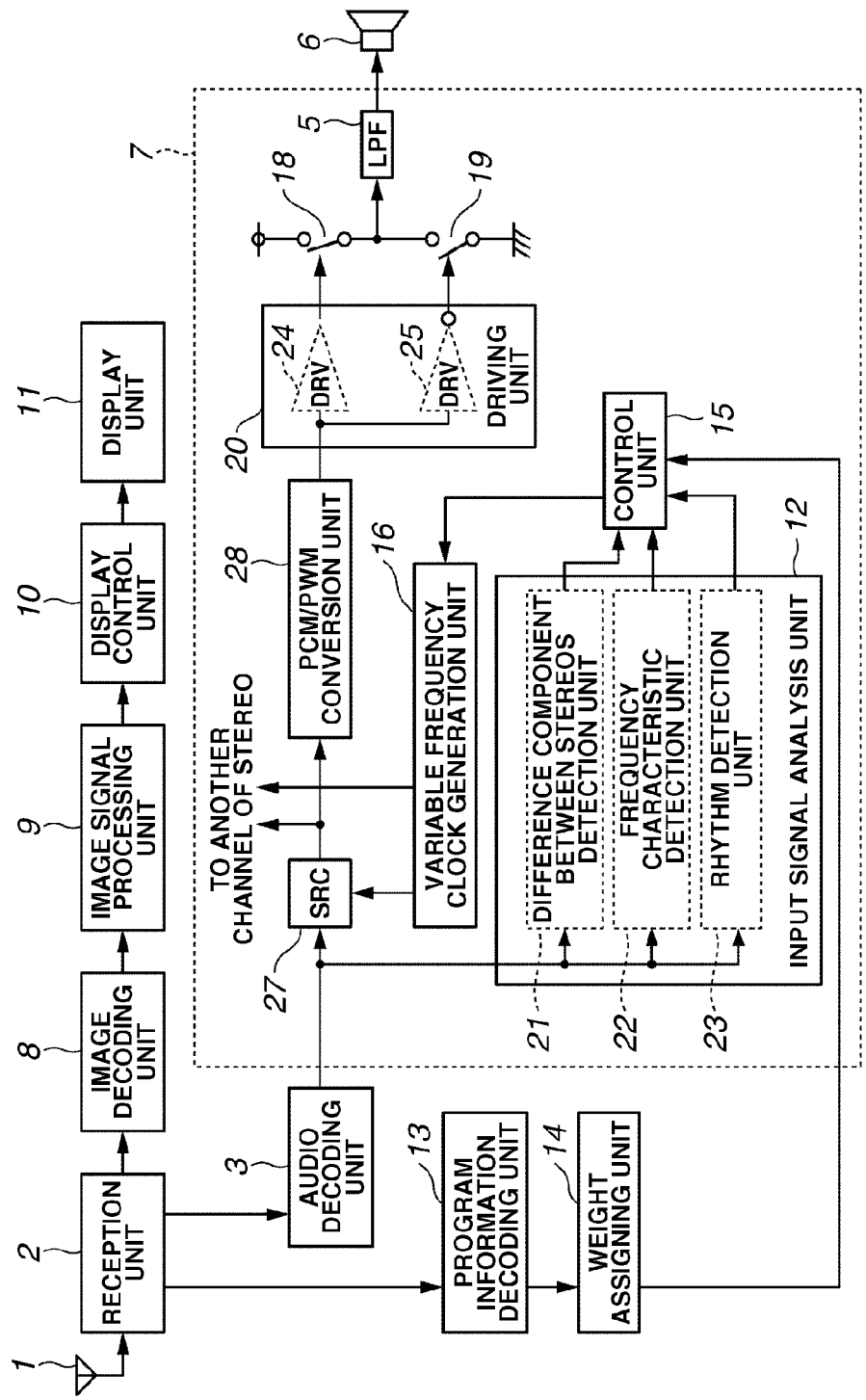
FIG. 8 is a block diagram illustrating a television receiving apparatus mounted with a digital amplifier according to a third exemplary embodiment of the present invention.

FIG. 8 is a block diagram of a television receiving apparatus mounted with a digital amplifier according to a third exemplary embodiment of the present invention. The television receiving apparatus of the present embodiment is similar to the television receiving apparatus of the first embodiment, and as such, the reference numbers used in the first embodiment are used in the present embodiment where applicable and detailed descriptions are omitted herein.

Audio data decoded by the audio decoding unit 3 is input into the input signal analysis unit 12 including a digital signal processor (DSP) which simply computes a digital signal. Simultaneously, the audio data is converted by a sampling rate conversion unit (SRC) 27 into a PCM digital signal synchronized with the clock that the variable frequency clock generation unit 16 outputs. The PCM digital signal is converted by a pulse code modulation/pulse width modulation (PCM/PWM) conversion unit 28 into a pulse modulation signal synchronized with a sampling frequency of the PCM digital signal.

In the present exemplary embodiment, the audio signal is converted into the pulse modulation signal without being converted into the analog signal. Therefore, a digital amplifier can be implemented that is not affected by an external noise, operates with fidelity, and realizes low electric consumption.

Fourth Exemplary Embodiment

Figure 9:
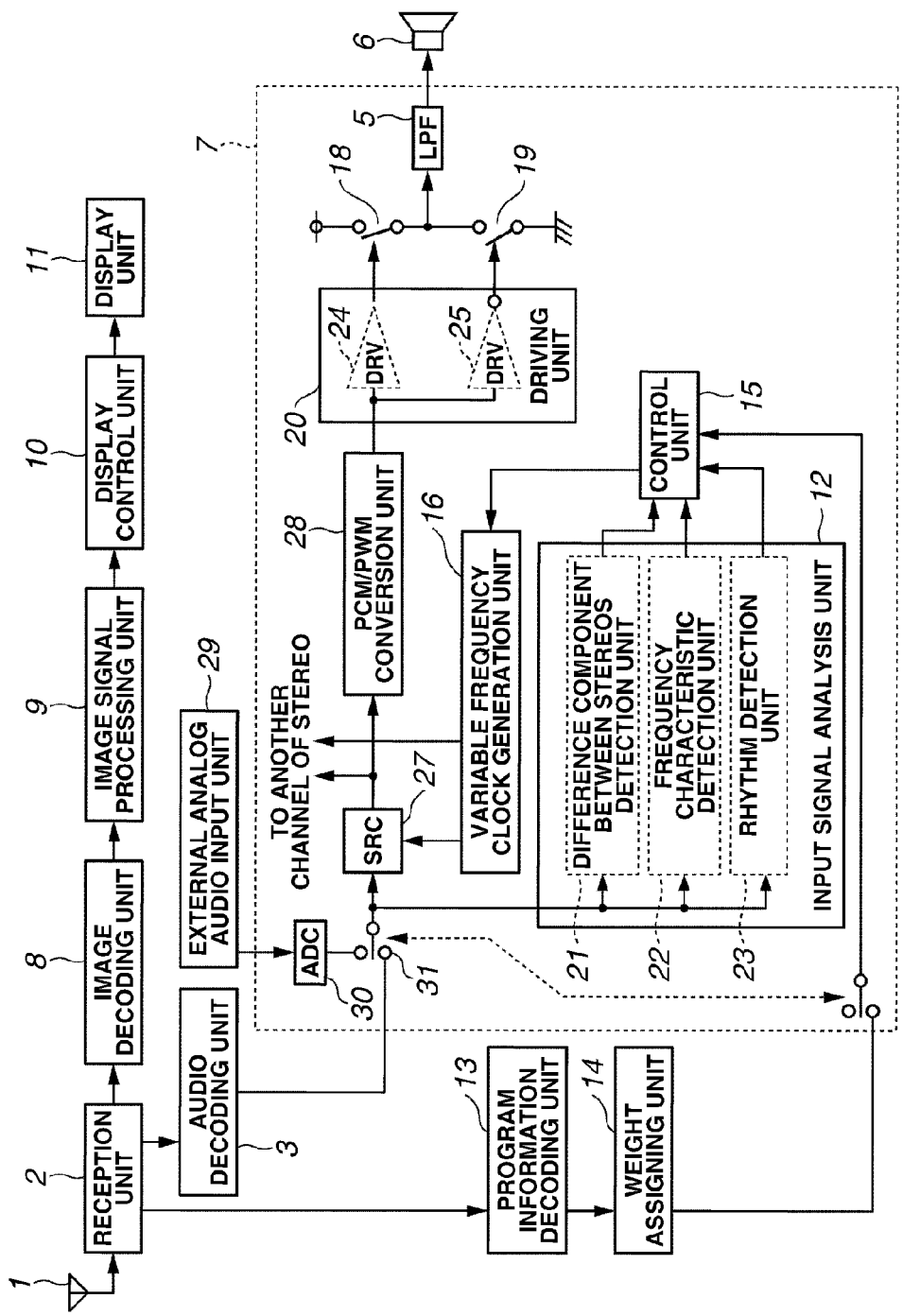
FIG. 9 is a block diagram illustrating a television receiving apparatus mounted with a digital amplifier according to a fourth exemplary embodiment of the present invention.

FIG. 9 is a block diagram illustrating a television receiving apparatus mounted with a digital amplifier according to a fourth exemplary embodiment of the present invention. The television receiving apparatus of the present embodiment is similar to the television receiving apparatus of the first embodiment, and as such, the reference numbers used in the first embodiment are used in the present embodiment where applicable and detailed descriptions are omitted herein.

Audio input to an external analog audio input unit 29 is converted into audio data by an A/D converter (ADC) unit 30, and one of audio data from the audio decoding unit 3 and audio data from the A/D converter (ADC) unit 30 is selected by an input switching unit 31. In the input switching unit 31, two switches are operated interlocked with each other. When the audio data from the A/D converter (ADC) unit 30 is selected, the input switching unit 31 is switched such that the output from the weighting unit 14 according to the type of the category is not referred to. According to the present exemplary embodiment, the clock frequency is set to the audio input from the external analog input unit 29. Therefore, a digital amplifier can be implemented which realizes audio fidelity and low electric power consumption.

According to the above-described exemplary embodiments of the present invention, in response to the characteristics of an input signal, the switching frequency of a digital amplifier is set to the most suitable value. Accordingly, low electric power consumption is achieved without being affected by the characteristics of the audio output. More specifically, each output of the input signal analysis unit, the temperature detection unit and the decoding unit is comprehensively considered so that the digital amplifier can be operated at the most suitable frequency. Therefore, not only are audio fidelity and low electric power consumption accomplished, but miniaturization of and safety of the apparatus can be improved.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2006-040962 filed Feb. 17, 2006, which is hereby incorporated by reference herein in its entirety.

What is claimed is:

1. A television receiving apparatus, comprising:
    a reception unit configured to receive a television broadcast signal;
    a program information decoding unit configured to decode program-related information included with the television broadcast signal;
    an audio decoding unit configured to decode audio data output from the reception unit to output an audio input signal;
    a weighting unit configured to output a category signal that is weighted for each type of category of the program-related information;
    a clock generation unit configured to output a clock signal;
    a pulse width modulation unit configured to pulse width-modulate the clock signal based on the audio input signal;
    a converting unit configured to convert output of the pulse width modulation unit and output to a loudspeaker;
    a control unit configured to control frequencies of the clock signal based on the category signal,
    wherein when the category signal corresponds to a news category, the control unit controls the clock generation unit so that the clock signal becomes low frequency, compared to when the category signal corresponds to a music category; and
    an analysis unit configured to analyze signal characteristics of the audio input signal, wherein the analysis unit includes at least one of
    (i) a stereos detection unit configured to output a parameter in accordance with a difference between L level and R level of the audio input signal,
    (ii) a frequency characteristic detection unit configured to output a parameter in accordance with a comparison result between medium frequency level and high and low frequency level of the audio input signal, and
    (iii) a rhythm detection unit configured to output a parameter in accordance with an amplitude change of the audio input signal,
    wherein one of (a), (b), and (c) is performed based on parameter output from the analysis unit
    wherein (a) is controlling the clock generation unit so that the clock signal becomes low frequency when a difference between L level and R level of the audio input signal is small, compared to when a difference between L level and R level of the audio input signal is large,
    wherein (b) is controlling the clock generation unit so that the clock signal becomes low frequency when medium frequency level of the audio input signal is larger than high and low frequency level, compared to when medium frequency level of the audio input signal is smaller than high and low frequency level, and
    wherein (c) is controlling the clock generation unit so that the clock signal becomes low frequency when the amplitude change of the audio input signal is gentle, compared to when amplitude change of the audio input signal is sever.

2. The television receiving apparatus according to claim 1, wherein, when the category signal corresponds to one of a movie category and a variety category, the control unit controls the clock generation unit so that the clock signal becomes low frequency, compared to when the category signal corresponds to a music category, and controls the clock generation unit so that the clock signal becomes high frequency, compared to when the category signal corresponds to a news category.

3. A method for a television receiving apparatus, the method comprising:
    receiving a television broadcast signal;
    decoding program-related information included with the television broadcast signal;
    decoding audio data output to output an audio input signal;
    outputting a category signal that is weighted for each type of category of the program-related information;

outputting a clock signal;

pulse width-modulating the clock signal based on the audio input signal;

converting output of pulse width-modulating the clock signal and outputting to a loudspeaker;

controlling frequencies of the clock signal based on the category signal, wherein when the category signal corresponds to a news category, the clock signal becomes low frequency, compared to when the category signal corresponds to a music category; and analyzing signal characteristics of the audio input signal, and at least one of (i) outputting a parameter in accordance with a difference between L level and R level of the audio input signal, (ii) outputting a parameter in accordance with a comparison result between medium frequency level and high and low frequency level of the audio input signal, and (iii) outputting a parameter in accordance with an amplitude change of the audio input signal, wherein one of (a), (b), and (c) is performed based on parameter output, wherein (a) is the clock signal becomes low frequency when a difference between L level and R level of the audio input signal is small, compared to when a difference between L level and R level of the audio input signal is large, wherein (b) the clock signal becomes low frequency when medium frequency level of the audio input signal is larger than high and low frequency level, compared to when medium frequency level of the audio input signal is smaller than high and low frequency level, and wherein (c) the clock signal becomes low frequency when the amplitude change of the audio input signal is gentle, compared to when amplitude change of the audio input signal is sever.

4. The method according to claim 3, wherein, when the category signal corresponds to one of a movie category and a variety category, the clock signal becomes low frequency, compared to when the category signal corresponds to a music category, and the clock signal becomes high frequency, compared to when the category signal corresponds to a news category.

* * * * *